(12) United States Patent
Wang et al.

(10) Patent No.: US 9,905,672 B2
(45) Date of Patent: Feb. 27, 2018

(54) METHOD OF FORMING INTERNAL DIELECTRIC SPACERS FOR HORIZONTAL NANOSHEET FET ARCHITECTURES

(71) Applicant: Samsung Electronics Co., Ltd., Suwon-si, Gyeonggi-do (KR)

(72) Inventors: Wei-E Wang, Austin, TX (US); Mark S. Rodder, Austin, TX (US); Borna J. Obradovic, Leander, TX (US); Dharmendar Reddy Palle, Austin, TX (US); Joon Goo Hong, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/276,784

(22) Filed: Sep. 26, 2016

(65) Prior Publication Data

US 2017/0338328 A1    Nov. 23, 2017

Related U.S. Application Data

(60) Provisional application No. 62/340,467, filed on May 23, 2016.

(51) Int. Cl.
| | |
|---|---|
| *H01L 21/00* | (2006.01) |
| *H01L 29/66* | (2006.01) |
| *H01L 21/02* | (2006.01) |
| *H01L 29/08* | (2006.01) |

(Continued)

(52) U.S. Cl.
CPC .... *H01L 29/66553* (2013.01); *H01L 21/0245* (2013.01); *H01L 21/0259* (2013.01); *H01L 21/02236* (2013.01); *H01L 21/02532* (2013.01); *H01L 29/045* (2013.01);
(Continued)

(58) Field of Classification Search
None
See application file for complete search history.

(56) References Cited

U.S. PATENT DOCUMENTS

| | | | |
|---|---|---|---|
| 2005/0104131 A1* | 5/2005 | Chidambarrao | .... H01L 21/8213 257/369 |
| 2007/0287269 A1* | 12/2007 | Yokokawa | ........ H01L 21/76254 438/478 |

(Continued)

FOREIGN PATENT DOCUMENTS

| | | |
|---|---|---|
| WO | 2015050546 A1 | 4/2015 |
| WO | 2015147792 A1 | 10/2015 |

*Primary Examiner* — Reema Patel
(74) *Attorney, Agent, or Firm* — Renaissance IP Law Group LLP

(57) ABSTRACT

A method to form a nanosheet stack for a semiconductor device includes forming a stack of a plurality of sacrificial layers and at least one channel layer on an underlayer in which a sacrificial layer is in contact with the underlayer, each channel layer being in contact with at least one sacrificial layer, the sacrificial layers are formed from SiGe and the at least one channel layer is formed from Si; forming at least one source/drain trench region in the stack to expose surfaces of the SiGe sacrificial layers and a surface of the at least one Si channel layer; and oxidizing the exposed surfaces of the SiGe sacrificial layers and the exposed surface of the at least one Si layer in an environment of wet oxygen, or ozone and UV.

19 Claims, 4 Drawing Sheets

(51) Int. Cl.
*H01L 29/10* (2006.01)
*H01L 29/04* (2006.01)

(52) U.S. Cl.
CPC ...... *H01L 29/0847* (2013.01); *H01L 29/1033* (2013.01); *H01L 29/66636* (2013.01)

(56) References Cited

U.S. PATENT DOCUMENTS

2008/0248644 A1\* 10/2008 Liu .................. C23C 16/22
 438/653
2009/0127584 A1\* 5/2009 Morand ............. H01L 29/785
 257/192
2015/0380313 A1 12/2015 Ching et al.

\* cited by examiner

METHOD OF FORMING INTERNAL DIELECTRIC SPACERS FOR HORIZONTAL NANOSHEET FET ARCHITECTURES

CROSS-REFERENCE TO RELATED APPLICATION

This patent application claims the priority benefit under 35 U.S.C. § 119(e) of U.S. Provisional Patent Application No. 62/340,467, filed on May 23, 2016, the disclosure of which is incorporated herein by reference in its entirety.

BACKGROUND

Field Effect Transistors (FETs) formed using nanosheet (NS) or nanowire (NW) channel layers may include internal spacers at one or both ends of the channel layers. The internal spacers may be used to reduce the parasitic capacitance between the final gate structure and source/drain (SD) regions. The internal spacers are conventionally formed after etching a SD trench region in a vertical stack of nanosheet layers (comprised of a stack of sacrificial layers and channel layers) and then forming a lateral recess in the sacrificial layers to a desired recess width by an etching process that is selective to the channel layers. The lateral recesses are then refilled by a dielectric deposition and etch process.

For both of nFET and pFET devices that have sacrificial layers, there are challenges associated with using a conventional dielectric deposition and etch process to form the internal spacers. A first such challenge is to provide a controllable lateral recess width in the sacrificial layers. An etch process (wet or dry) to form the lateral recesses may result in a variability of the width of the recess for different sacrificial layers within a tall stack of nanosheet layers, for example, in cases in which the width of the recess may be large, that is, on the order of about 4 nm to about 10 nm.

Another challenge is that if a deposition process is used to fill in the recess region to form an internal spacer, the deposition material may also be deposited along vertical sidewalls that are exposed within the SD trench regions, thereby requiring an etch process to remove the deposited material from the exposed vertical sidewalls. The etch process of the deposited material, which may also be on the order of about 4 nm to about 10 nm thick, may result in an additional variability in the net width of a formed internal spacer.

During the formation of the internal spacers, yet a third challenge may be a detrimental reduction in stress that may have been present in the nanosheet layers after the SD trench regions have been etched in the vertical stack in which a greater (detrimental) stress reduction corresponds to a larger lateral recess width into the sacrificial layers for an internal spacer. For example, a tensile-strain of a Si-channel nFET resulting from compressively-strained SiGe sacrificial layers may be significantly reduced due to the recessed portion of the SiGe sacrificial layers. That is, the free space created from the internal spacer recess in the SiGe sacrificial layer may result in up to about a 50% reduction of strain loss for about a 4 nm to about an 8 nm recess width. Similar strain reduction situations may occur for pFET-type devices.

A fourth challenge relates to seams that may develop in situations of tight inter-nanosheet spacing (INS) between nanosheet stacks and/or small vertical spacing (VSP) between channel layers. That is, for a tight INS, a seam may develop within the center of an etched SD trench region if the internal spacer thickness that is deposited is larger than the INS. Similarly, a seam may be formed inside an internal spacer for a vertical spacing VSP of, for example, about 10 nm (i.e., the sacrificial SiGe layer thickness) for about a 5 nm thick internal spacer recess. Either type of seam may be undesirable if they introduce high variability and reliability issues for the subsequent processes that may be used to form NS/NW FET devices, and ultimately for the NS/NW FET devices.

SUMMARY

An example embodiment provides a method to form a nanosheet stack for a semiconductor device that includes forming a stack of a plurality of sacrificial layers and at least one channel layer on an underlayer in which a sacrificial layer may be in contact with the underlayer, each channel layer may be disposed between and in contact with two sacrificial layers, the sacrificial layers may be formed from SiGe and the at least one channel layer may be formed from Si; forming at least one source/drain trench region in the stack to expose surfaces of the SiGe sacrificial layers and a surface of at least one Si channel layer; and oxidizing the exposed surfaces of the SiGe sacrificial layers and the exposed surface of the at least one Si layer in an environment of wet oxygen, or ozone and UV. In one embodiment, the oxidized Si channel layer and a corresponding amount of the oxidized SiGe sacrificial layers may be removed. In one embodiment, the SiGe sacrificial layers comprise a percentage of Ge that is at least about 25% Ge.

An example embodiment provides a method to form an internal spacer in a nanosheet stack that includes forming a stack of a plurality of sacrificial layers and a plurality of channel layers on the underlayer in which a sacrificial layer may be in contact with the underlayer, each channel layer may be disposed between and in contact with two sacrificial layers, the sacrificial layers may be formed from SiGe and the at channel layers may be formed from Si; forming at least two source/drain trench regions in the stack to expose surfaces of the SiGe sacrificial layers and the Si channel layers in each source/drain trench region; and oxidizing the exposed surfaces of the SiGe sacrificial layers and the exposed surfaces of the Si layers in an environment of wet oxygen, or ozone and UV in which an amount of the oxidized SiGe sacrificial layers between the first and second source/drain trench regions may be at least about four times greater than an amount of the oxidized Si channel layers between the first and second source/drain trench regions. In one embodiment, the SiGe sacrificial layers may include a percentage of Ge that is at least about 25% Ge.

An example embodiment provides a method to form a stack for a semiconductor device that includes forming a stack of a plurality of SiGe sacrificial layers and a plurality of Si channel layers on an underlayer in which a sacrificial layer may be in contact with the underlayer, each channel layer may be disposed between and in contact with two sacrificial layers, and the SiGe sacrificial layers may include a percentage of Ge that is greater than about 25% Ge; forming a plurality of source/drain trench regions in the stack to expose surfaces of the SiGe sacrificial layers and surfaces of the Si channel layers; and oxidizing the exposed surfaces of the SiGe sacrificial layers and the exposed surfaces of the Si layers in an environment of wet oxygen, or ozone and UV.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

Figure 1A:
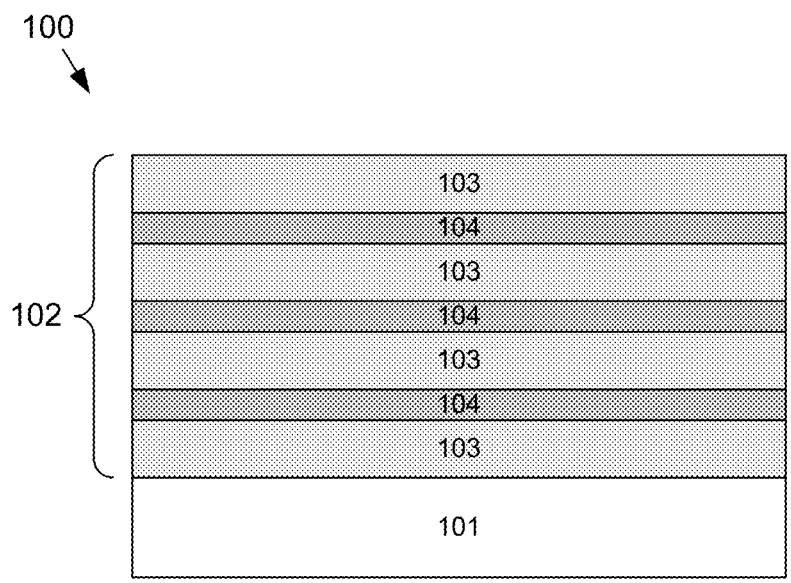
FIGS. 1A-1D respectively depict a sequence of sectional views of a first embodiment of a NS stack having internal spacers that may be used for an hNS FET according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claimed subject matter.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein relates to devices, such as, but not limited to, field effect transistors (FETs), that contain one or more stacks of nanosheets (NS s) and/or one or more stacks of nanowires (NWs). As used herein, the term "nanosheet" means a conductive structure having a cross-sectional area that is substantially perpendicular to the direction of current transport through the nanosheet, and in which one of the Cartesian cross-sectional dimensions is noticeably smaller in comparison to the other dimension. For example, a nanosheet may include a conductive structure having a cross-sectional area in which one of the Cartesian cross-sectional dimensions ranges from a few nanometers to about 20 nm, and the other Cartesian cross-sectional dimensions ranges from about 15 nm to about 70 nm. Also as used herein, the term "nanowire" means a conductive structure having a cross-sectional area that is substantially perpendicular to the direction of current transport through the nanowire and in which the Cartesian cross-sectional dimensions are similar and small. For example, a nanowire may include a conductive structure having a cross-sectional area in which the Cartesian cross-sectional dimensions may range from a few nanometers to about 20 nm. As used herein, the terms "nanosheet," "NS," "nanowire" and "NW" may be used interchangeably. Moreover, if the term "nanosheet" or the term "nanowire" is used without the other term, it should be understood that the other term is also impliedly included. Further, the terms "nanowire" and "nanosheet" may be referred to herein as layers. The term "stack" as used herein may refer to a plurality of sacrificial layers and a plurality of channel layers having dimensions that are consistent with being nanosheets and/or nanowires, and that are formed in a stack of an alternating sequence of sacrificial layers and channel layers. Further still, the phrases "NS release," "NW release," and "release" as used herein refer to removal of the sacrificial layers from the initial stack. Reference herein to the lattice parameter of a sacrificial layer means that the lattice parameter of the sacrificial layer is what it would be if relaxed. As used there, the expression "at the end of the processing" may refer to any step in the fabrication flow following a deep source and drain recess or similar cuts of the stack.

The subject matter disclosed herein provides a method of forming internal spacers for a horizontal nanosheet (hNS) FET that may be suitable for both nFET and pFET devices, or for only one type of device, e.g., nFET. In one embodiment, the subject matter disclosed herein utilizes an inherent-forming internal spacer (IISP) technique that is enabled by a high preferential oxidation ratio (HPOR) that is associated with SiGe in comparison to Si. That is, the subject matter disclosed herein utilizes the significant different oxidation kinetics of pure Si from that of SiGe to form internal spacers for hNS FET devices. Additionally, the subject matter disclosed herein provides a NS/NW stack structure that includes internal spacers that are formed using the significant different oxidation kinetics of pure Si from that of SiGe.

The oxidation rate of SiGe and Si is almost the same if the oxidizing agent is dry oxygen. In contrast, the oxidation of SiGe is highly preferred in many other environments, such as an environment of wet oxygen, or ozone and UV. A minor weak crystal orientation dependency (<15%) on the oxidation rate has been observed for Si and SiGe. In such cases, only Si atoms inside SiGe react with oxygen to form a silicon oxide with Ge acting as a catalytic agent. As a result, the unreacted Ge atoms tend to segregate (i.e., be "snow-plowed") at the oxidation front, which eventually enriches the Ge content of the remaining un-oxidized SiGe. This phenomenon may also be referred to as Ge condensation. Additionally, the oxidation rate may be further enhanced as the Ge content increases. The ratio of a preferred oxidation (i.e., HPOR) of SiGe has been demonstrated to be as high as four (4) for a medium Ge content of 36%. Therefore, an HPOR value greater than four (>4) may be obtained for a higher Ge-content SiGe sacrificial layer. Moreover, the process temperatures of interest to oxidize SiGe may be much lower than conventional silicon oxidation that is grown by thermally heating a wafer to 1000° C.

In general, the thickness of the silicon oxide formed may be controlled by the amount of silicon consumed. For example, roughly a thickness of $SiO_2$ of about 2X is formed for every X of thickness of silicon oxidized. This proportionality relation may hold consistent for a given SiGe alloy because very little Ge remains in the oxidized layer that is formed if SiGe is oxidized.

An additional benefit of Ge condensation may be a strain-enhancing benefit. The SiGe region in the front of a preferred oxidation may keep being enriched as a direct result from snow-plowed Ge atoms. A greater tensile strain may be induced in a silicon channels that are directly adjacent to (i.e., above and/or below) a SiGe sacrificial region that has been enriched with the additional Ge during preferred oxidation of the SiGe. For example, the tensile strain of a tensile-strained Si channel may be increased (about 10% to about 20%) as a direct result of a compressively stained SiGe layer below and above the Si channel for a large (i.e., about 8 nm) inherently-formed internal spacer. Thus, the subject matter disclosed herein may provide a benefit of retaining and/or enhancing a tensile strain in a Si channel nFET device.

The subject matter disclosed herein of forming the internal spacer (IISP) in a NS/NW stack by utilizing a high preferential oxidation ratio (HPOR) of SiGe in comparison to Si may eliminate the disadvantages associated with the conventional techniques used to form internal spaces in a NS/NW stack and provide the benefits of (1) providing a robust technique to controllably form lateral recess widths to form internal spacers in sacrificial SiGe layers that is pattern independent; (2) eliminating a need for an etch process to remove the internal spacer material that may have been deposited on the exposed vertical sidewalls; (3) providing a strain-retaining feature because no free space generated as the internal spacers are formed; (4) providing a technique to form internal spacers in a NS/NW stack that is INS and VSP independent so that no seams (i.e., seamless) are formed in the SD trench regions and/or the internal spacer regions; and (5) a lower capacitive internal spacer because $SiO_2$ is used as a dielectric rather than a nitride, e.g., $Si_3N_4$.

In some embodiments, the subject matter disclosed herein may be used only for an nFET device in order to retain and/or enhance a tensile strain of the nFET device. In some embodiments, a lateral recess may be utilized with the thermal oxidation technique disclosed herein for some or all of the nFET and pFET devices in an integrated circuit. For example, a lateral recess (e.g., about 1 nm to about 3 nm) before or after the method of thermal oxidation of the nFET device may enable a SD wrap of a Si channel region at the ends of the Si channel. In one embodiment, during the oxidation process that forms the internal spacers, the exposed sacrificial SiGe is laterally oxidized to become $SiO_2$ to reach an interim thickness that equals the sum of the final desired thickness of the internal spacer plus a thickness of an ultra-thin layer of $SiO_2$ (about 0.5 nm) that about corresponds to an oxidized portion of the Si channel that will be removed at the subsequent etch-removal process. That is, during the oxidation process the exposed surfaces of the Si channels may also be oxidized slightly to form an ultra-thin (0.5 nm) layer of $SiO_2$. Subsequently, about a 1 nm thickness oxide removal process may be applied to completely remove the $SiO_2$ on the exposed Si channel surfaces along with about a 1 nm of $SiO_2$ from the oxidized sacrificial SiGe surfaces. The etch removal leaves exposed silicon channel surfaces that are clean and ready for a subsequent source/drain EPI, plus an internal $SiO_2$ spacer in place.

FIGS. 1A-1D respectively depict a sequence of sectional views of a first embodiment of a NS stack 100 having internal spacers that may be used for a hNS FET according to the subject matter disclosed herein. FIG. 2 depicts a flow diagram of an embodiment of a method 200 to form an NS stack having internal spacers that may be used for a hNS FET according to the subject matter disclosed herein.

The first embodiment of a NS stack 100 may provide, for example, an extreme value of HPOR (e.g., greater than about 20) such that the preferred oxidation of SiGe sacrificial layers far exceeds the oxidation of Si channel layers with a minimum oxidation from the SiGe sacrificial layers being formed in Si channel layers that are below and above the SiGe sacrificial layers.

At 201 in FIG. 2, an underlayer 101 (as shown in FIG. 1) may be formed on, for example, a substrate (not shown), using well-known deposition techniques. As used herein, the term "underlayer" may mean a strain-relaxed buffer (SRB), an elastically strained buffer, or any underlayer material having a lattice parameter that may substantially match the lattice parameter that the to-be-formed stack would have if the stack in isolation was allowed to relax coherently. Typically, an underlayer may be substantially a single crystal. Examples of underlayer materials may include Si, SiGe, SiGe alloys or other semiconductor alloys. In one embodiment, the underlay may simply be a silicon substrate. In one embodiment, the surface orientation of the substrate may be (100). In another embodiment, the surface orientation of the substrate may be (110). In still another embodiment, the surface orientation of the substrate may be (111).

Also at 201, a stack 102 (FIG. 1A) of sacrificial layers 103 and channel layers 104 are epitaxially formed on the underlayer 101 using well-known deposition techniques. The sacrificial layers 103 and the channel layers 104 are formed in an alternating sequence in which a sacrificial layer 103 is formed directly on the underlayer 101. In one embodiment, the stack 102 comprises a top sacrificial layer 103 formed on a channel layer 104. In one embodiment, the top sacrificial layer 103 is not formed as the top layer of the stack 102, if desired. The number of alternating layers of the stack 102 may be selected based on the desired configuration of the final device. It should be understood that the stack 102 does not plastically relax or substantially plastically relax by formation of defects that are generated in the stack at any point during method 200. Thus, after stack growth, the whole stack adopts substantially the same lattice parameter as the underlayer.

In one embodiment, the sacrificial layers 103 are formed from SiGe having a Ge % of about 25% to about 75%, and the channel layers 104 are formed from Si.

In one embodiment, the sacrificial layers 103 are formed from SiGe, the channel layers 104 are formed from Si, and the device is an nFET device.

It should be understood that the respective thicknesses, material properties (e.g., elastic parameters) and the respective lattice parameters of the sacrificial and channel layers may physically combine in the stack 102 so that the stack 102, if allowed to relax elastically, may have an overall lattice parameter that is based on a weighted average of the lattice parameters of the sacrificial and channel layers. The weighted average of the lattice parameters will be the lattice parameter that the stack of nanosheets would have if the stack in isolation was allowed to relax coherently. The resulting strain in the channel layers, after elastic relaxation of the stack, is then a function of the respective layer thicknesses of the sacrificial and channel layers, and their respective compositions, as well as of the elastic properties of the layers. A larger difference in lattice parameter between the sacrificial and channel layers results in higher levels of resulting strain in the channel after elastic relaxation of the stack. In one embodiment, the lattice parameter of stack 102 when allowed to relax coherently is more than or equal to the lattice parameter of silicon. In one embodiment, the material used for the sacrificial layers 103 is selected so that the intrinsic lattice parameter of the sacrificial layers 103 is more than or equal to the lattice parameter of the silicon channel layers 104. In one embodiment, the silicon channel layers 104 may have a thickness in the range of about 2 nm to about 6 nm, and the sacrificial layers 103 may have a thickness in the range of about 5 nm to about 30 nm. In one embodiment, the sacrificial layers 103 may have a thickness in the range of about 9 nm to about 20 nm.

Figure 1B:
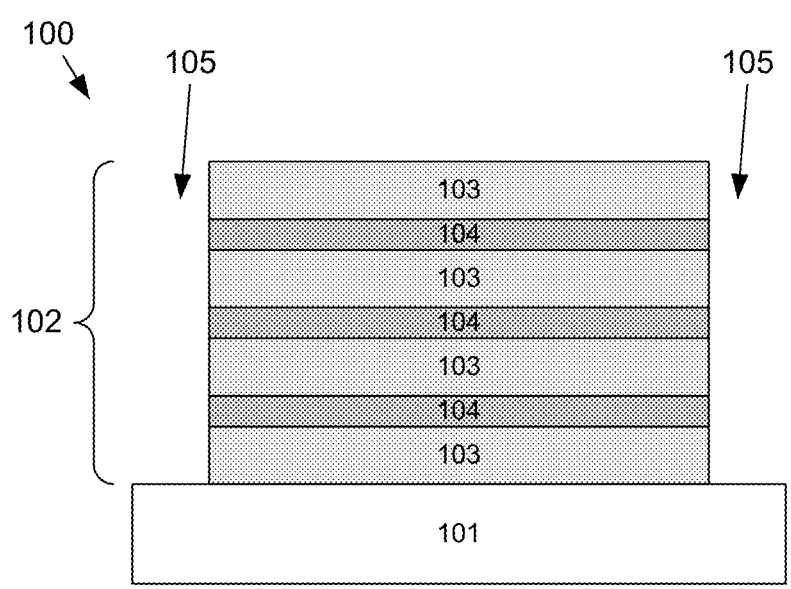
Figure 2:
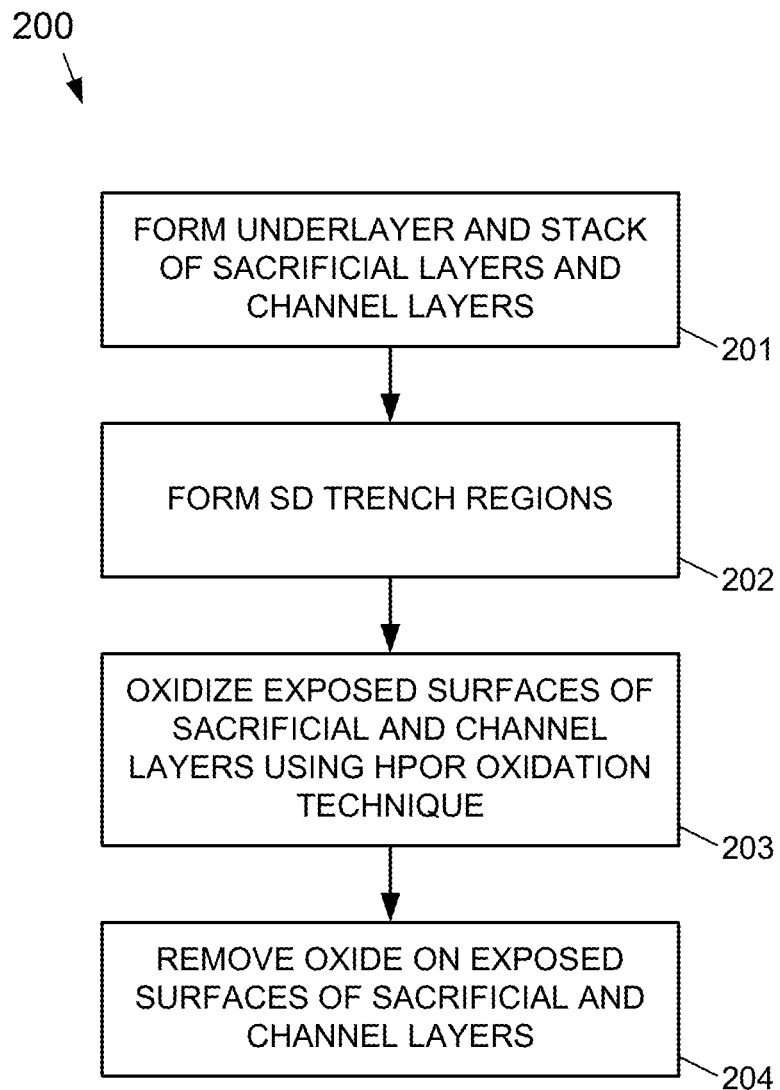
FIG. 2 depicts a flow diagram of an embodiment of a method to form an NS stack having internal spacers that may be used for a hNS FET according to the subject matter disclosed herein.

At 202 in FIG. 2, SD recesses (or structure cuts) may be formed in the stack 102 using a well-known technique to form spaces 105 that are source/drain trench regions (FIG. 1B). The spaces 105 extend through the stack 102 down to or down to about the underlayer 101. The regions of the stack 102 material left between the spaces 105 may be relatively short (e.g., less than about 200 nm), so that the remaining regions of stack material are substantially completely elastically relaxed in the direction normal to the cuts. Any strain in the channel layers of the regions of remaining stack material may be primarily determined by elastic deformation of the stack 102 at the point that the SD trench recesses (spaces 105) are formed (i.e., at 202 in FIG. 2), and may be a result of the effect of the sacrificial layers 103 straining the channel layers 104. That is, any strain in the channel layers 104 may be a function of the respective thicknesses of the sacrificial and channel layers, and their respective compositions. According to the subject matter disclosed herein, a desired portion of the strain state of the remaining regions of the stack 102 may be maintained throughout the rest of the manufacturing flow.

Figure 1C:
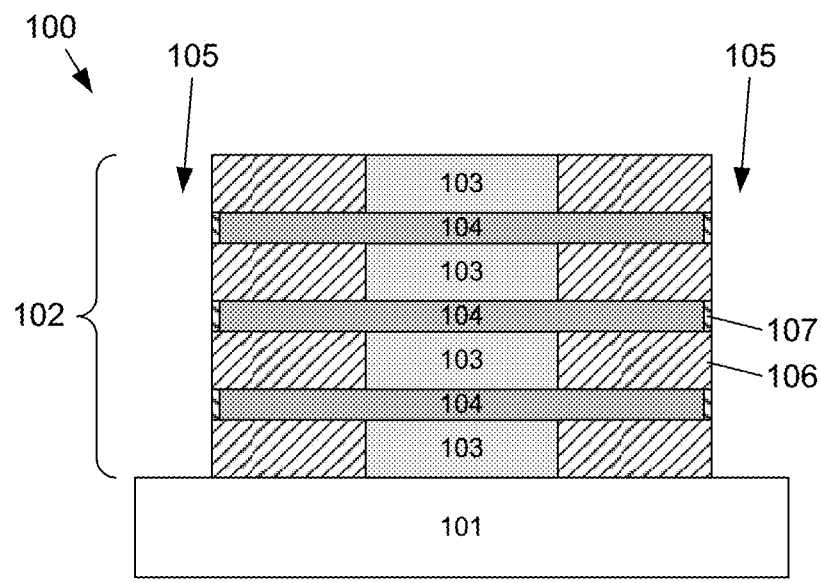
Figure 1D:
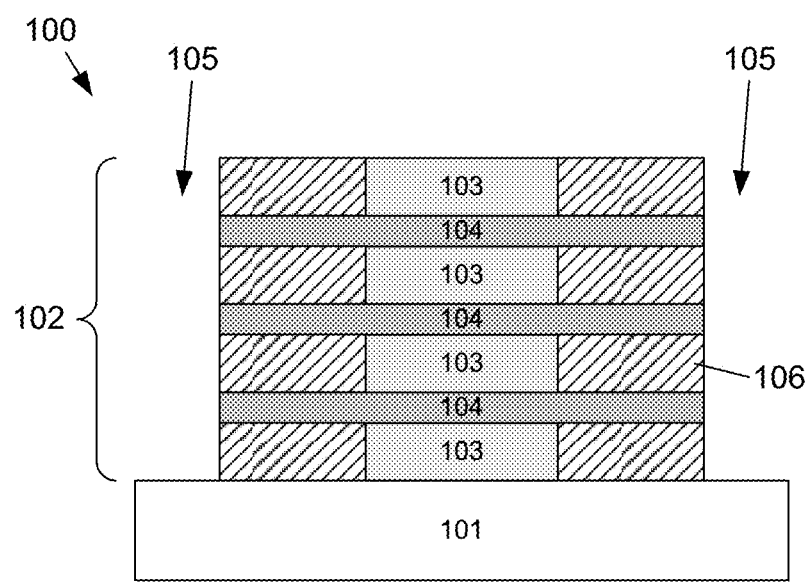

At 203 in FIG. 2, the edges of the sacrificial layers 103 and the channel layers 104 that were exposed when the spaces 105 were formed may be oxidized utilizing the high preferential oxidation ratio (HPOR) of SiGe in comparison to silicon (FIG. 1C). In one embodiment, the edges of the sacrificial layers 103 and the channel layers 104 may be oxidized in an environment of wet oxygen, or ozone and UV, at temperatures ranging from about 400° C. to about 800° C., and times from about 0.5 hour to about 8 hours. As depicted in FIG. 1C, the sacrificial layers 103 are oxidized at 106, and the channel layers 104 are oxidized at 107.

The oxidation process utilized at 203 avoids forming seams that are possible with tight inter-nanosheet spacing (INS) between nanosheet stacks and/or small vertical spacing (VSP) between channel layers. That is, the oxidation process utilized at 203 is INS- and VSP-independent. Any strain induced from the volume expansion from the oxidation of the silicon that is consumed may be relieved based on the available lateral free space on the ends of sacrificial layers facing the source/drain trench regions. From a process-control perspective, a medium low-temperature of wet $O_2$ or $O_3$/UV may be selected so that a large process window relating to process temperature and flow rate may be obtained, which is generally pattern independent and that may significantly alleviate a commonly observed severe-loading effect of many dry-etch processes, which are generally pattern dependent. From a capacitive-lowering perspective, $SiO_2$ provides a dielectric constant and a lower capacitive value than nitride.

At 204 in FIG. 2, the stack 100 may be etched to remove the oxide 107 from the channel layers 104. At the same time, the same amount of oxide 106 is removed from the sacrificial layers 103. Subsequently, further processing may be performed to form a device from the remaining stack 102, such as, but not limited to, a SD epi fill in the spaces 105.

Any negative effect of shortening the silicon channel (by 0.5 nm on either of the channel) may be no worse than that obtained from any other conventional selective-etch removal of the sacrificial SiGe layer using, for example, either HCl or TMAH before a nitride deposition due to the limited selectivity ratio of the HCl and TMAH. A strain-retaining feature may be provided by the subject matter disclosed herein in that no additional free space is released during oxidation in comparison to a conventional approach of forming internal spacers. Moreover, certain additional strain benefits may be realized as a direct result of the Ge enrichment/segregation for the remaining SiGe sacrificial layer after the HPOR according to the subject matter disclosed herein. Further, the nature of HPOR, i.e., a process utilizing only wet oxidation and a control oxide removal, may be an INS-independent approach because HPOR does not involve deposition and etch of a nitride.

A second embodiment may provide, for example, a medium-to-high value of HPOR (greater than about 5, but less than about 20) so that a small amount of oxidation from a SiGe sacrificial layer is allowed to "attack" a silicon channel below and above (i.e., a vertical oxidation). For the second embodiment, the sacrificial layers are formed from SiGe having a Ge % of about 25% to about 75%, and the channel layers are formed from Si. At the end the oxidation process, the exposed surfaces of a sacrificial SiGe layer are oxidized to $SiO_2$ to reach an interim lateral thickness that equals the sum of the final desired designated thickness of the internal spacer and a thin layer of $SiO_2$ (about 1 nm) that will be removed at the etch removal process. In this embodiment, an exposed silicon channel surface may also be expected to be oxidized to form a thin (about 1 nm) layer of $SiO_2$ both laterally and vertically. Subsequently, a 1 nm-thickness oxide removal process may be used to completely remove the $SiO_2$ on the exposed silicon channel surfaces and 1 nm of $SiO_2$ from the oxidized sacrificial SiGe surfaces. To mitigate the channel thickness reduction from the vertical oxidation, the silicon channel thickness may be increased from about 6 nm to about 8 nm. The extra 2 nm of the silicon channel may be removed at a later replacement metal gate (RMG) process, e.g., by a selective Si wet-etch or dry-etch process, or by oxidizing the exposed silicon surface in an oxidizing environment to form a 1 nm thick $SiO_2$. The 1 nm thick oxide that wraps around the silicon channel may be removed by an oxide (1 nm) removal process. Additionally, the remaining silicon channel after the etch process may be reduced back to a desired thickness of, for example, 6 nm.

Yet another embodiment provides that the SiGe sacrificial layers may comprise a percentage of Ge that is at least about 36% Ge.

Figure 3:
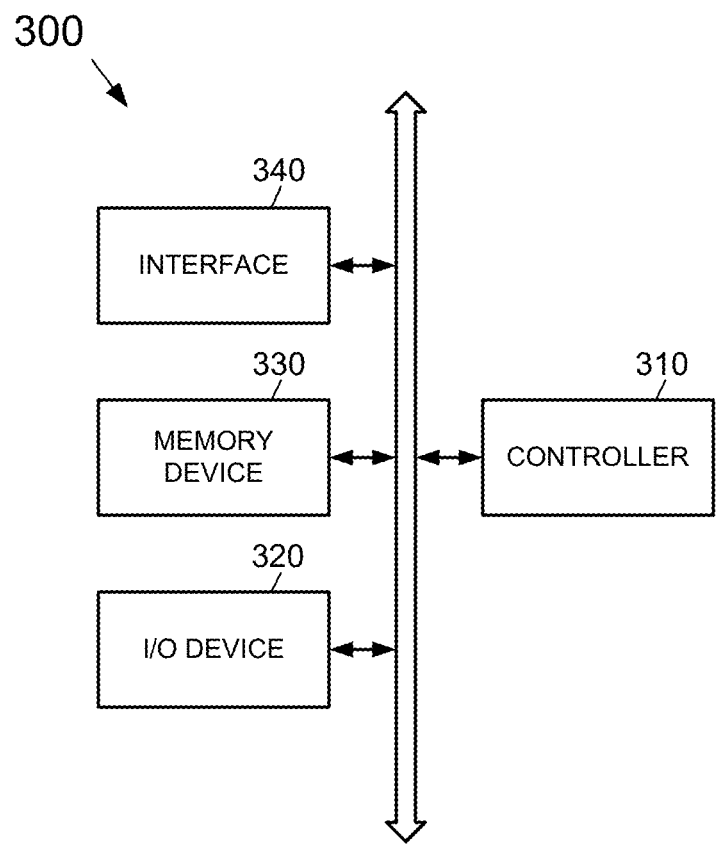
FIG. 3 depicts an electronic device that includes one or more integrated circuits (chips) that include an NS device according to the subject matter disclosed herein.

FIG. 3 depicts an electronic device 300 that includes one or more integrated circuits (chips) that include an NS device according to the subject matter disclosed herein. Electronic device 300 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 300 may include a controller 310, an input/output device 320 such as, but not limited to, a keypad, a keyboard, a display, or a touch-screen display, a memory 330, and a wireless interface 340 that are coupled to each other through a bus 350. The controller 310 may include, for example, at least one microprocessor, at least one digital signal process, at least one microcontroller, or the like. The memory 330 may be configured to store a command code to be used by the controller 310 or a user data. Electronic device 300 and the various system components including electronic device 300 may include an NS device according to the subject matter disclosed herein. The electronic device 300 may use a wireless interface 340 configured to transmit data to or receive data from a wireless communication network using a RF signal. The wireless interface 340 may include, for example, an antenna, a wireless transceiver and so on. The electronic system 300 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Figure 4:
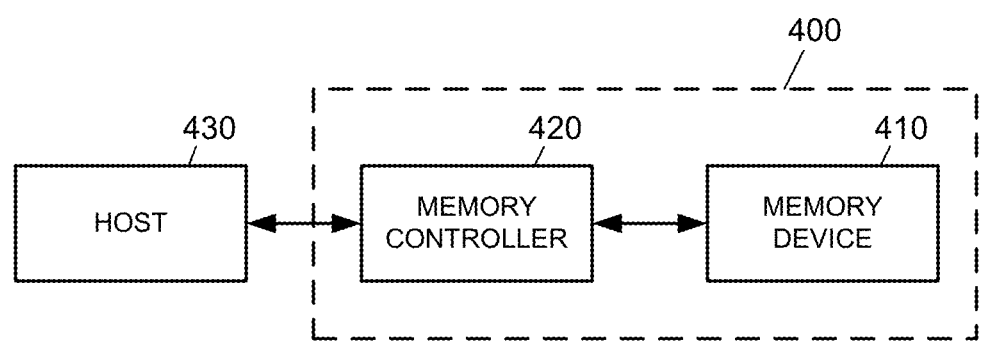
FIG. 4 depicts a memory system that may include an NS device according to the subject matter disclosed herein.

FIG. 4 depicts a memory system 400 that may include an NS device according to the subject matter disclosed herein. The memory system 400 may include a memory device 410 for storing large amounts of data and a memory controller 420. The memory controller 420 controls the memory device 410 to read data stored in the memory device 410 or to write data into the memory device 410 in response to a read/write request of a host 430. The memory controller 420 may include an address-mapping table for mapping an address provided from the host 430 (e.g., a mobile device or a computer system) into a physical address of the memory device 410. The memory device 410 may include one or more semiconductor devices that include an NS device according to the subject matter disclosed herein.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A method to form a nanosheet stack for a semiconductor device, the method comprising:
    forming a stack of a plurality of sacrificial layers and at least one channel layer on an underlayer,
    each channel layer being in contact with at least one sacrificial layer, and the sacrificial layers being formed of SiGe and the at least one channel layer being formed of Si;

forming at least one source/drain trench region in the stack to expose first surfaces of the SiGe sacrificial layers and a first surface of the at least one Si channel layer;

oxidizing the exposed first surfaces of the SiGe sacrificial layers to form oxidized SiGe sacrificial layers and the exposed first surface of the at least one Si layer to form an oxidized Si channel layer in an environment of wet oxygen, or ozone and UV, wherein the oxidized SiGe sacrificial layers include outer parts overlapped with the oxidized Si channel layer and inner parts non-overlapped with the oxidized Si channel layer;

removing the oxidized Si channel layer to expose a second surface of the at least one Si layer; and removing partially the oxidized SiGe sacrificial layers so that the outer parts of the oxidized SiGe sacrificial layers are removed and the inner parts of the oxidized SiGe sacrificial layers remain, wherein the removing of the oxidize Si channel layer and the removing partially of the oxidized SiGe sacrificial layers are performed at substantially the same time.

2. The method of claim 1, wherein the SiGe sacrificial layers comprise a percentage of Ge that is at least about 25% to about 75% Ge.

3. The method of claim 1, wherein the at least one Si channel layer comprises a tensile stress.

4. The method of claim 1, wherein a length of the oxidized SiGe sacrificial layers is at least four times greater than a length of the oxidized Si channel layer.

5. The method of claim 4, wherein the length of the oxidized SiGe sacrificial layers is at least 20 times greater than the length of the oxidized Si channel layer.

6. The method of claim 1, wherein the oxidized SiGe layers are seamless.

7. A method to form an internal spacer in a nanosheet stack, the method comprising:

forming an underlayer;

forming alternately a plurality of sacrificial layers and a plurality of channel layers on the underlayer to form a stack of the plurality of sacrificial layers and the plurality of channel layers, a bottommost sacrificial layer of the plurality of sacrificial layers being in direct contact with the underlayer, and the plurality of sacrificial layers being formed of SiGe and the plurality of channel layers being formed of Si;

forming a first source/drain trench region and a second source/drain trench region in the stack to expose surfaces of the SiGe sacrificial layers and surfaces of the Si channel layers in each of the first source/drain trench region and the second source/drain trench region;

oxidizing the exposed surfaces of the SiGe sacrificial layers and the exposed surfaces of the Si channel layers to form oxidized SiGe sacrificial layers and oxidized Si channel layers at a temperature between about 400° C. and about 800° C. in an environment of wet oxygen, or ozone and UV, a length of the oxidized SiGe sacrificial layers between the first and second source/drain trench regions being at least four times greater than a length of the oxidized Si channel layers between the first and second source/drain trench regions, the oxidized SiGe sacrificial layers including outer parts overlapped with the oxidized Si channel layers and inner parts non-overlapped with the oxidized Si channel layers; and removing partially the oxidized SiGe sacrificial layers so that the outer parts of the oxidized SiGe sacrificial layers are removed and the inner parts of the oxidized SiGe sacrificial layers remain.

8. The method of claim 7, wherein the SiGe sacrificial layers comprise a percentage of Ge that is at least about 25% Ge.

9. The method of claim 8, wherein the SiGe sacrificial layers comprise a percentage of Ge that is greater than about 25% Ge.

10. The method of claim 7, wherein the Si channel layers comprises a tensile stress.

11. The method of claim 10, wherein the Si channel layers comprise an nFET device.

12. The method of claim 7, wherein a distance through the stack between the first and second source/drain trench regions is less than about 200 nm.

13. The method of claim 12, wherein the length of the oxidized SiGe sacrificial layers between the first and second source/drain trench regions is at least 20 times greater than the length of the oxidized Si channel layers between the first and second source/drain trench regions.

14. The method of claim 7, wherein the underlayer has a surface orientation of (100), (110) or (111).

15. A method to form a stack for a semiconductor device, the method comprising:

forming alternately a plurality of SiGe sacrificial layers and a plurality of Si channel layers on an underlayer to form a stack of the plurality of SiGe sacrificial layers and the plurality of Si channel layers;

forming a plurality of source/drain trench regions in the stack to expose surfaces of the SiGe sacrificial layers and surfaces the Si channel layers; and oxidizing the exposed surfaces of the SiGe sacrificial layers to form oxidized SiGe sacrificial layers and the exposed surfaces of the Si channel layers to form oxidized Si layers in an environment of wet oxygen, or ozone and UV, wherein the oxidized SiGe sacrificial layers include outer parts overlapped with the oxidized Si channel layers and inner parts non-overlapped with the oxidized Si channel layers;

removing the oxidized Si channel layers; and removing partially the oxidized SiGe sacrificial layers so that the outer parts of the oxidized SiGe sacrificial layers are removed and each of the inner parts of the oxidized SiGe sacrificial layers is interposed between two adjacent Si channel layers that remain unoxidized after the oxidizing of the exposed surfaces of the Si channel layers.

16. The method of claim 15, wherein the plurality of Si channel layers comprise a tensile stress.

17. The method of claim 15, wherein a length of the oxidized SiGe sacrificial layers is at least four times greater than a length of the oxidized Si channel layers.

18. The method of claim 17,
wherein the length of the oxidized SiGe sacrificial layers is at least 20 times greater than the length of the oxidized Si channel layers.

19. The method of claim 1,
wherein the oxidized Si channel layer removed and the outer parts of the oxidized SiGe sacrificial layers partially removed have substantially the same thickness.

\* \* \* \* \*